United States Patent [19]

Dobberpuhl

[11] Patent Number: 5,172,016
[45] Date of Patent: Dec. 15, 1992

[54] FIVE-VOLT TOLERANT DIFFERENTIAL RECEIVER

[75] Inventor: Daniel W. Dobberpuhl, Shrewsbury, Mass.

[73] Assignee: Digital Equipment Corporation, Maynard, Mass.

[21] Appl. No.: 724,407

[22] Filed: Jun. 28, 1991

[51] Int. Cl.⁵ .................. H03K 19/0175; H03K 19/70
[52] U.S. Cl. .................. 307/475; 307/296.5; 307/448; 307/451; 307/497
[58] Field of Search .............. 307/448, 451, 475, 443, 307/296.4, 296.5, 496, 497

[56] References Cited

U.S. PATENT DOCUMENTS

| | | | |
|---|---|---|---|
| 4,698,526 | 10/1987 | Allan | 307/475 |
| 4,724,344 | 2/1988 | Watanabe | 307/497 |
| 4,825,110 | 4/1989 | Yamaguchi et al. | 307/448 |
| 4,853,560 | 8/1989 | Iwamura et al. | 307/296.1 |
| 4,929,853 | 5/1990 | Kim et al. | 307/475 |
| 4,965,469 | 10/1990 | Kondoh et al. | 307/446 |
| 4,999,529 | 3/1991 | Morgan, Jr. et al. | 307/475 |

FOREIGN PATENT DOCUMENTS 0005724  1/1987  Japan ................... 307/448

Primary Examiner—Edward P. Westin
Assistant Examiner—Andrew Sanders
Attorney, Agent, or Firm—Arnold, White & Durkee

[57] ABSTRACT

A differential, CMOS receiver includes a transistor, coupled in parallel with an input transistor, which limits voltage differentials across an input transistor. A corresponding, similarly sized transistor balances current loading in a differential transistor. The transistor in parallel with the input transistor, whose drain is coupled directly to the power supply, quickly pulls the input transistor source and drain up to power supply voltage on an input transient from logical zero to a logical one which exceeds the power supply voltage. Another transistor coupled between the output node and the power supply rail defeats differential amplifier action when the input voltage is high out of its normal range.

16 Claims, 1 Drawing Sheet

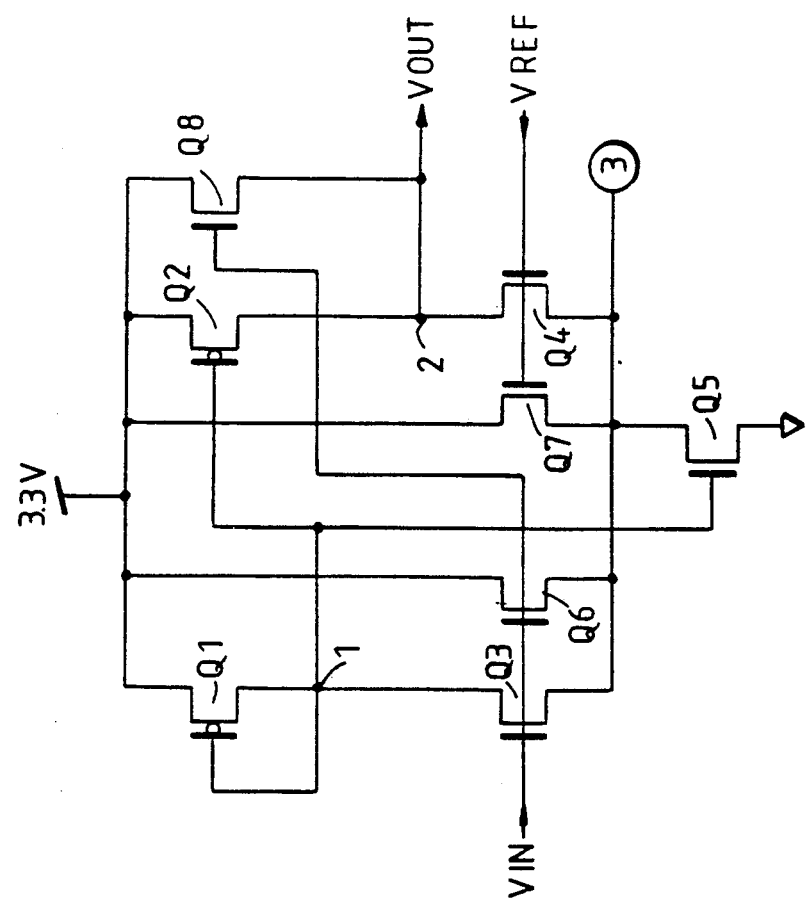
FIG. 3
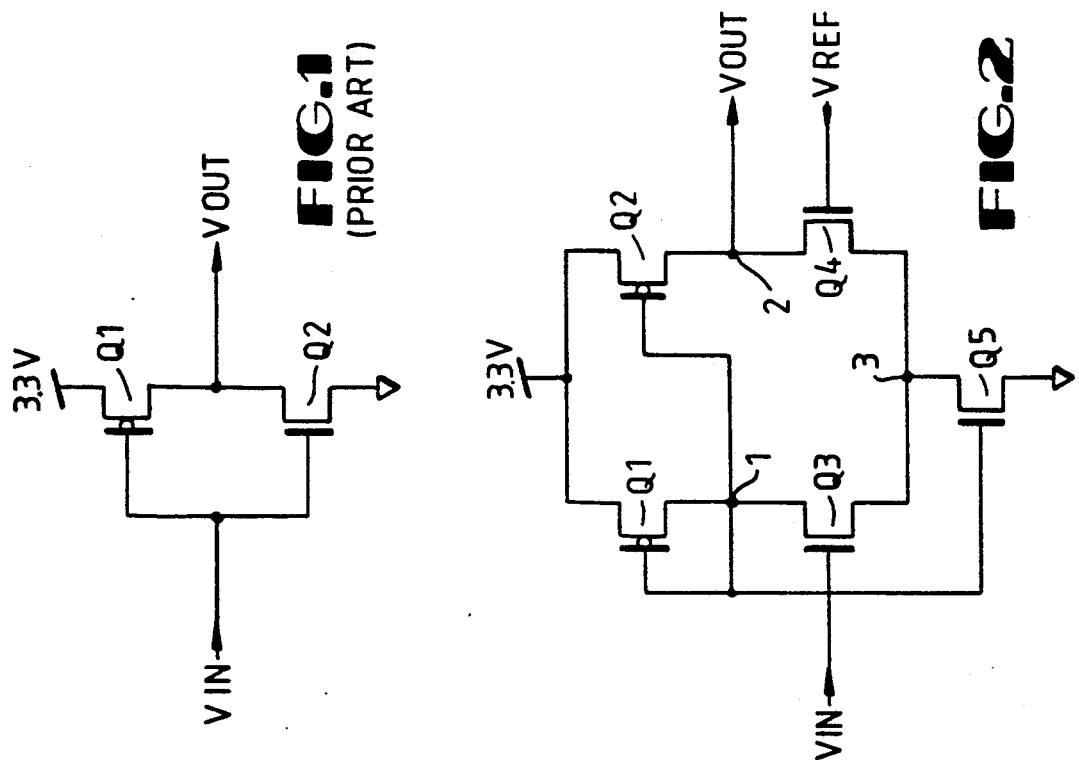
FIG. 1
(PRIOR ART)
FIG. 2

FIVE-VOLT TOLERANT DIFFERENTIAL RECEIVER

FIELD OF THE INVENTION

This invention relates generally to a differential receiver that can tolerate an input logic signal from a device powered by a power supply voltage of 5 volts. More particularly, this invention relates to a CMOS differential amplifier that is capable of coupling a logic circuit having voltage levels up to 5 volts to a logic circuit powered by a lower voltage such as, for example, 3.3 v.

BACKGROUND OF THE INVENTION

As Complementary Metal Oxide Semiconductor (CMOS) devices have gotten progressively smaller, power supply voltages have been correspondingly reduced to reduce the deleterious effects of voltage differentials across increasingly smaller device dimensions. However, this reduction, from a nominal 5 volts to 3.3 volts has not occurred simultaneously with all manufacturers. Nor has this reduction occurred in all semiconductor devices with which other semiconductor devices must communicate. Thus, a Very Large Scale Integrated (VLSI) chip designed to operate at 3.3 volts may need to interface with another chip operating at 5 volts.

To perform the interface properly requires special circuit or device techniques to avoid stress on components designed for 3.3 volts operation. The alternative is added cost for extra manufacturing steps necessary to make devices which can tolerate higher voltages. Alternative designs also may require greater chip area occupied by buffer circuits.

A typical CMOS receiver stage is simply a ratioed inverter which is designed to work with the prescribed voltage levels (commonly TTL: maximum voltage level for a logic 0 ($V_{0max}$) is 0.8 volts; minimum voltage level for a logic 1 ($V_{1min}$) is 2.0 volts). Such a typical CMOS receiver is depicted in FIG. 1. However, the maximum input voltage in a standard system is likely to be the 5 volts supply. If 5 volts is applied to the receiver stage of FIG. 1, $Q_2$ will have gate-to-source and gate-to-drain voltages of 5 volts. For devices designed to operate normally at 3.3 volts, 5 volts across these terminals can result in immediate destruction of the device.

Thus, there remains a need for a CMOS receiver stage that can operate normally with a power supply voltage of 3.3 volts and yet tolerate an input voltage of 5 volts.

SUMMARY OF THE INVENTION

The present invention provides a pair of complementary input transistors which limit the maximum voltage difference across the transistor receiving the data input signal. The invention further provides a group of transistors which speed transient response while protecting input stages of the receiver. The invention also provides a corresponding pair of transistors to receive a reference voltage and to balance the current load in the circuit.

The invention enables the coupling of logic devices of disparate power supply voltages.

These and other features of this invention will become more apparent by reference to the following description when taken in conjunction with the accompanying figures.

BRIEF DESCRIPTION OF THE DRAWING FIGURES

FIG. 1 depicts a prior art receiver stage;

FIG. 2 depicts a voltage tolerant CMOS receiver stage; and

FIG. 3 depicts a preferred embodiment of the voltage tolerant CMOS receiver stage of the present invention.

DETAILED DESCRIPTION OF A PREFERRED EMBODIMENT

FIG. 2 depicts a receiver stage. In this configuration, the logic input signal is applied to $Q_3$ while a reference voltage $V_{ref}$ (approximately $\{[V_{0max}+V_{1min}]/2\}$ or about 1.4 volts for TTL) is applied to $Q_4$. All of the transistors depicted in FIGS. 1, 2, and 3 are enhancement mode devices. This circuit provides the advantage that the voltage at node 3 will tend to follow the higher of the $V_{in}$ and $V_{ref}$ and thereby limit the voltage differences across $Q_3$. However, it has been found that $Q_1$ limits the maximum high level on node 1 and node 3. More importantly, $Q_1$ limits the transient response such that node 1 and node 3 lag $V_{in}$, resulting in excessive voltages occurring during the input transient from a logic 0 to a logic 1 whenever $V_{in}$ exceeds 3.3 volts.

$Q_5$ simply serves as a self-biased current sink.

The receiver stage depicted in FIG. 3 solves this problem by the inclusion of transistors $Q_6$, $Q_7$, and $Q_8$. $V_{in}$ feeds the parallel combination of $Q_3$ and $Q_6$. $Q_6$ provides a source of current to charge node 3 during the high voltage transition from a logic 0 to a logic 1 at $V_{in}$. The gate width of $Q_6$ is small in relation to the gate width of $Q_3$, preferably about 10% of the width of $Q_6$. The gate of $Q_6$ is just big enough to charge node 3 fast enough to follow an input ramp. This action precludes excess voltage differentials across $Q_3$, particularly when the logic device providing $V_{in}$ operates at greater than 3.3 volts such as 5 volts. The drain of $Q_6$ is tied directly to the 3.3 volt supply and on a transition from a logic 0 to a logic 1, willquickly pull node 3 to a voltage approaching 3.3 volts (limited by the current sink action of $Q_5$).

Node 1 can be charged through $Q_3$ and is not limited by $Q_1$. Transistor $Q_7$ balances the effect of $Q_6$. In other words, ignoring for a moment the effects of $Q_6$ and $Q_7$, $Q_3$ and $Q_4$ would normally act as a differential amplifier. The gate width of $Q_7$ is small in relation to the gate width of $Q_4$. With $V_{in}=V_{ref}$, $Q_3$ and $Q_4$ draw the same current. Now, with $Q_6$ in place, $Q_7$ is required to balance the current loads in the amplifier. The addition of $Q_6$ and $Q_7$ have a negligible effect on the amplifier characteristics in the normal region of operation ($V_{in} \leq 3.3$ v). However, when $V_{in} > 3.3$ v, the higher voltage on node 3 results in higher voltages on node 1 causing an improper biasing effect on $Q_2$. Normally, when $V_{in} > V_{ref}$, $Q_4$ is cutoff and $Q_2$ pulls the output high. In this case, $Q_4$ is correctly turned off but $Q_2$ is also tending to cutoff. Transistor $Q_8$ counters this tendency. When $V_{in}$ is low (<0.8 v), $Q_8$ does not prevent the output from going low. When $V_{in}$ is high (>2.0 v), $Q_8$ reinforces $Q_2$, and when $V_{in}$ is very high (>3.3 v), $Q_8$ provides the complete drive to the output node. That is, when $V_{in} > 3.3$, the receiver may be considered to be operating out of its normal operating band, and in this case $Q_8$ overrides the differential amplifier action. In this case, $Q_8$ ties the 3.3 volt supply to node 2 and thus to $V_{out}$.

While the present invention has been described in connection with a preferred embodiment, those of ordinary skill in the art will recognize many modifications to the present invention and this application is intended to cover any adaptations or variations of the invention.

I claim:

1. A differential receiver comprising:
   a. first and second transistors coupled in parallel to a data input;
   b. third and fourth transistors coupled in parallel to a reference voltage input line;
   c. a fifth transistor coupling the first, second, third, and fourth transistors to ground;
   d. a sixth transistor coupling the first transistor to a voltage supply;
   e. a seventh transistor for coupling the first and second transistors to a data output; and
   f. an eighth transistor coupling the data input to the data output.

2. The differential receiver of claim 1 wherein the transistors are field effect transistors.

3. The differential receiver of claim 1 wherein the sixth and seventh transistors are P-channel field effect transistors and the remaining transistors are N-channel field effect transistors.

4. The differential receiver of claim 2 wherein the gate width of the second transistor is small in relation to the gate width of the first transistor.

5. A method of receiving any of different supply voltages in a differential receiver, comprising the steps of:
   a. receiving an input logic signal in a parallel pair of first and second transistors;
   b. receiving a reference voltage in a parallel pair of third and fourth transistors;
   c. coupling the first, second, third, and fourth transistors to ground through a fifth transistor;
   d. coupling a the first transistor to a biasing voltage supply by way of a sixth transistor;
   e. coupling the first and second transistors to a data output by way of a seventh transistor; and
   f. coupling the input logic signal to the data output by way of an eighth transistor.

6. A differential amplifier comprising:
   a. a biasing power supply;
   b. a reference voltage source;
   c. a first transistor coupleable to an input logic signal;
   d. a second transistor in parallel with the first transistor, the drain of the second transistor coupled to the biasing power supply;
   e. a third transistor in parallel with the first transistor, the drain of the third transistor coupled to the biasing power supply and the source of the third transistor coupled to an output node;
   f. a fourth transistor coupling the drain of the first transistor to the biasing power supply;
   g. a fifth transistor coupled to the reference voltage source, the drain of the fifth transistor coupled to the output node;
   h. a sixth transistor in parallel with the fifth transistor, the drain of the sixth transistor coupled to the biasing power supply;
   i. a seventh transistor coupling the sources of the first, second, fifth, and sixth transistors to ground; and
   j. an eighth transistor coupled at its gate to the drain of the first transistor, at its drain to the biasing power supply, and at its source to the output node.

7. The differential amplifier of claim 6 wherein the fourth and eighth transistors are P-channel field effect transistors and the remaining transistors are N-channel field effect transistors.

8. The differential receiver of claim 6 wherein the gate width of the second transistor is small in relation to the gate width of the first transistor.

9. The differential receiver of claim 6 wherein the gate width of the sixth transistor is small in relation to the gate width of the fifth transistor.

10. A differential circuit comprising:
    first and second input transistors, each having a source-to-drain path and a gate, the gate of the first transistor being connected to a second input, the source-to-drain paths of the first and second transistors being each connected at one end to a common node, the other end of the source-to-drain path of the second transistor being connected to an output;
    third and fourth output transistors, each having a source-to-drain path and a gate, the source-to-drain paths of the third and fourth transistors being separately connected from the other ends of said source-to-drain paths of said first and second transistors and a first supply terminal, said other end of the source-to-drain path of said first transistor being connected to the gates of the third and fourth transistors;
    a fifth transistor having a source-to-drain path connecting said common node to a second supply terminal and having a gate connected to said gates of said third and fourth transistors; and
    a sixth transistor having a source-to-drain path connected between said first supply terminal and said output, and having a gate connected to said input.

11. A circuit according to claim 10 wherein said first and second transistors are N-channel and said third and fourth transistors are P-channel.

12. A circuit according to claim 10 wherein said second input is a reference input.

13. A circuit according to claim 10 including seventh and eighth transistors, each having a source-to-drain path connected between said common node and said first supply terminal, the seventh transistor having a gate connected to said first input, said eighth transistor having a gate connected to said second input.

14. A circuit according to claim 13 wherein said first, second, fifth, sixth, seventh and eighth transistors are N-channel, and said third and fourth transistors are P-channel.

15. A circuit according to claim 14 wherein said first supply terminal is connected to a positive voltage and said second supply terminal is connected to ground.

16. A circuit according to claim 15 wherein said second input is a reference voltage.

* * * * *